March 24, 1970 B. S. ARONSON 3,502,953

SOLID STATE CURRENT CONTROLLED DIODE WITH A NEGATIVE RESISTANCE CHARACTERISTIC

Filed Jan. 3, 1968

INVENTOR.
Bernard S. Aronson

BY William J. Simmons Jr.

ATTORNEY

United States Patent Office 3,502,953
Patented Mar. 24, 1970

3,502,953

SOLID STATE CURRENT CONTROLLED DIODE WITH A NEGATIVE RESISTANCE CHARACTERISTIC

Bernard S. Aronson, Elmira, N.Y., assignor to Corning Glass Works, Corning, N.Y., a corporation of New York Filed Jan. 3, 1968, Ser. No. 695,436
Int. Cl. H01l 5/00, 3/00
U.S. Cl. 317—238 7 Claims

ABSTRACT OF THE DISCLOSURE

A semiconducting titanium dioxide-silicon junction exhibiting asymmetric current-controled negative resistance and rectification. The diode is constructed by depositing a layer of semi-insulating titanium dioxide on the surface of a high resistivity semiconductor body, partially reducing the film to semiconducting titanium dioxide, applying a carrier-injecting electrode to the titanium dioxide layer and an ohmic contact to the semiconductor body.

BACKGROUND OF THE INVENTION

With the present tendency toward microminaiturization of circuitry, a need has arisen for devices which can be formed by thin-film techniques. In the fabrication of integrated thin-film circuits, it is desirable to fabricate different types of components from a single element and the oxides of that element. It is known that by changing the density of the oxygen vacancies in rutile titanium dioxide, the resistivity of the titanium dioxide can be varied from 1 to $10^{13}$ ohm-centimeters and that titanium dioxide can have the properties of a conductor, a semiconductor (both n-type and p-type conduction) or an insulator. Furthermore, titanium dioxide films having sheet resistivities of 1 to $10^9$ ohms per square have been formed. Such films have been utilized for the formation of thin-film components such as capacitors, diodes, and transistors. However, two terminal devices exhibiting asymmetric current-controlled negative resistance have not been heretofore fabricated from thin titanium dioxide films.

SUMMARY OF THE INVENTION

It is therefore an object of the present invention to provide a negative resistance diode which can be formed by thin-film techniques.

Another object of this invention is to provide, for use in microcircuits, a thin-film, negative resistance diode which is compatable with other thin-film components such as resistors, capacitors, diodes, and transistors.

Still another object of this invention is to provide a negative resistance diode which is easily fabricated.

A further object of this invention is to provide a novel method for fabricating a negative resistance diode.

Briefly, the negative resistance diode according to this invention consists of a semiconductor body having at least one planar surface, and a layer of partially reduced titanium dioxide on the planar surface. Conductive means on the surface of the titanium dioxide layer is provided for injecting carriers into this layer, and an ohmic contact is provided on the semiconductor body. This diode is fabricated by depositing a film of titanium dioxide on one face of a crystalline semiconductor body, and reducing the film until it becomes semiconductive. Thereafter, the carrier injecting contact and ohmic contact are applied to the reduced titanium dioxide film and the semiconductor body respectively.

DETAILED DESCRIPTION

Figure 1:
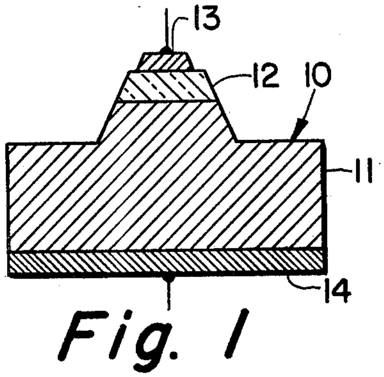
FIG. 1 is a cross-sectional view of a discrete negative resistance diode constructed in accordance with this invention.

Referring to FIG. 1, a negative resistance diode 10 in accordance with this invention is shown. The diode 10 consists of a semiconductor body 11 on which a layer 12 of partially reduced, semiconducting titanium dioxide is located. The titanium dioxide layer must be a continuous film, the thickness of which can be up to about 20,000 Angstroms. An ohmic contact 14, which is made to the surface of the body 11, may consist of any conductive material such as gold-antimony which makes a good electrical connection to the semiconductor body. For other metals suitable for making this ohmic contact, reference may be made to Chapters 8 and 13 of Hunter, Handbook of Semiconductor Electronics, McGraw-Hill, 2nd edition (1962). An electrode 13, which is deposited on the layer of titanium dioxide, may consist of any metal which can inject carriers into semiconducting titanium dioxide. Metals such as silver, palladium, nickel, gold, antimony, copper, zinc and cadmium are suitable for use as the electrode 13.

The body 11 may consist of either p-type or n-type high resistivity semiconductor material which preferably has a resistivity of at least 40 ohm centimeters. This type of material has a bulk carrier concentration of about $10^{12}$ to $10^{14}$ atoms per cubic centimeter and preferably has a bulk carrier concentration of about $10^{13}$ atoms per cubic centimeter.

Figure 2:
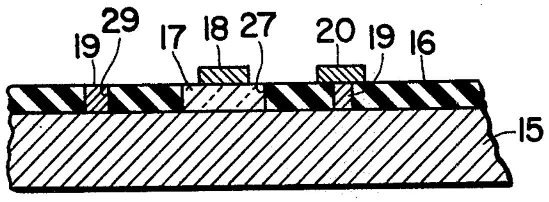
FIG. 2 is a cross-sectional view of a negative resistance diode formed on a portion of a semiconductive integrated circuit wafer.

As shown in FIG. 2, the negative resistance diode according to this invention may be made as part of a microcircuit on a semiconductor wafer by utilizing such well known techniques as vapor-deposition, masking, and etching. In FIG. 2, a semiconductor wafer 15 is shown having an insulating layer 16 on the surface thereof. If silicon is selected as the semiconductor material, the layer 16 may conveniently consist of silicon dioxide. A layer of titanium dioxide 17 is deposited in a window or opening 27 in the insulating layer, a carrier injecting electrode 18 being deposited on the layer 17. An ohmic contact is made to the semiconductor by depositing a metallic layer 19 within an annular window 29 in the insulating layer. A terminal 20 is deposited on the insulating layer 16 in contact with the conducting ring 19. The annular window 29 could be replaced by a circular opening similar to the window 27.

The invention will be further described in the following examples relating to the preparation of a negative resistance diode according to this invention.

Example 1

The faces of a silicon wafer were lapped parallel to each other, and one face was subsequently polished to a mirror finish and cleaned. The silicon was n-type and had a bulk resistivity of 100 ohm-cm. at room temperature.

A solution containing 100 ml. of tetra-iso-propyl titanate ($C_{12}H_{28}O_4Ti$) and 50 ml. of isopropyl alcohol was sprayed for about four seconds on the polished surface of the silicon wafer at a temperautre of about 700° C. in air, resulting in the formation of a film of titanium dioxide on the silicon wafer. Then the titanium dioxide film was partially reduced in an atmosphere consisting of 8% hydrogen and 92% nitrogen (per volume) at a temperature of 900° C. for one hour.

Before reduction, the titanium dioxide was an insulator at room temperature. However, after reduction, the titanium dioxide film had a resistivity of approximately 30 ohm-cm. The titanium dioxide film had a uniform thickness of about 5,000 Angstorms before and after thermal reduction.

The reduced titania-coated silicon wafer was chemically degreased and cleaned with filtered deionized water. A mesa etch was employed to limit the area of the device and to reduce reverse leakage currents. A rectangular array of circular etch-resist dots was applied to the surface of the wafer by conventional photoresist techniques. In general, the surface preparation and the photoresist application and development may be carried out in accordance with the recommendations set forth in Kodak Photosensitive Resists for Industry, Kodak Publication No. P–7, 1962, a copy of which may be obtained from Sales Service Division, Eastman Kodak Company, Rochester, N.Y. The reverse side of the wafer was completely covered with photoresist. The unmasked portions of the reduced titanium dioxide film were subjected to etching by sulfuric acid. Residual sulfuric acid was removed from the wafer by rinsing it in deionized water. The masked wafer was subsequently subjected to a chemical polish etch comprising a hydrofluoric and nitric acid mixture to obtain a mesa structure having a lateral height of 1 ml. The remaining photoresist was removed, and the wafer was degreased and rinsed in deionized water. Painted silver contacts were applied to the the titanium dioxide surfaces and were fired at 750° C., and antimony-doped gold was applied to the back side of the silicon wafer. The wafer was cut to provide discrete diodes and external leads were attached thereto.

Example 2

A substrate which had been lapped, polished and cleaned in accordance with Example 1 was placed in a 5 M solution of $TiCl_4$ in an ice bath containing 54.9 ml. $TiCl_4$ in 1,000 ml. of water. The temperature of the solution was raised to about 65° C. for about 70 minutes, during which time the titanium tetrachloride reacted slowly by the process of hydrolysis to cause titanium dioxide to precipitate onto the silicon substrate. This substrate was washed in deionized water and was dried in air at 350° C. for 5 minutes. The titanium dioxide film was then reduced in accordance with the method set forth in Example 1, and silver paint was applied to the titanium dioxide and fired at 750° C. A gold-antimony electrode was applied to the silicon.

Figure 3:
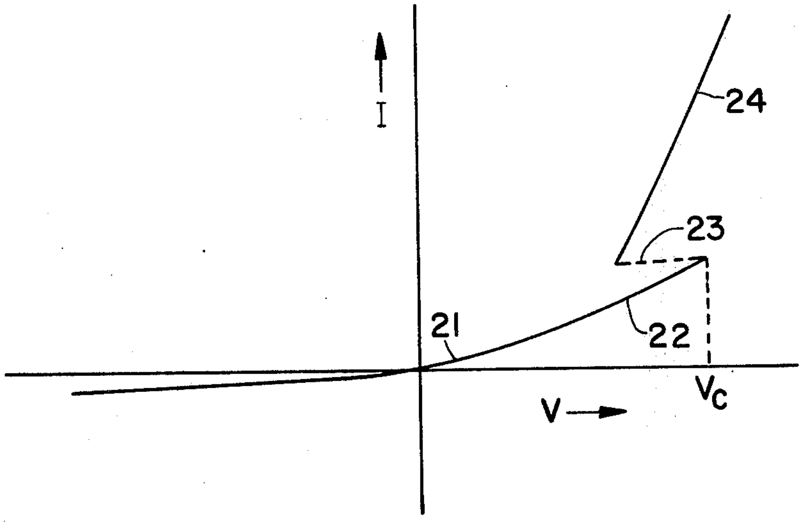
FIG. 3 is a graphical illustration of a typical voltage-current characteristic of the device shown in FIGS. 1 and 2.

Prior to the reduction step the semi-insulating titanium dioxide-silicon device of Examples 1 and 2 exhibited a rectification ratio of $10^4$ at 4 volts. After the titanium dioxide film was converted by reduction to a semiconductor having a resistivity of about 30 ohm/cm., the rectification ratio was reduced to $10^2$ and a current-controlled negative resistance region appeared in the forward bias mode as shown in FIG. 3. In the forward conduction region of the current-voltage characteristic curve (silicon biased negative with respect to the titanium dioxide), the initial portion 21 of the curve demonstrated an ohmic relationship. At increasing voltages, the slope became proportional to the 1.6 power of the voltage as shown at portion 22 of the curve. Following the interruption by the negative resistance region 23, a high-conductance region 24 was observed, the current being equal to the 2.7 power of the voltage. The switching time from the high-impedance state to the low-impedance state was found to be less than 1 micro-second. No negative resistance was observed when the device was reverse biased.

Switching between high and low impedance states can be initiated by illuminating a device with light which is in the visible regon of the spectrum. For such operation, the device is biased just below the critical voltage, $V_c$, so that the increased conductivity caused by illumination thereof causes the device to switch to the high conduction state.

Many transition metal oxide-semiconductor devices were tested, but only the combination of a high resistivity semiconductor and reduced titanium dioxide with a carrier injecting contact gave rise to negative resistance under forward bias. This phenomenon is probably related to minority carrier injection as evidenced by the observed asymmetrical conduction which is illustrated in FIG. 3. The double injection process is a possible explanation for the presence of negative resistance following breakdown at a critical forward voltage.

I claim:

1. A negative resistance semiconductor diode comprising a crystalline semiconductor body having at least one planar surface;

a semiconductor layer of partially reduced titanium dioxide on said one planar surface; said body and layer in combination being means for producing a negative resistance characteristic;

conductive means on the surface of said titanium dioxide layer for injecting current carriers therein; and an ohmic contact on said semiconductor body.

2. A semiconductor diode in accordance with claim 1 wherein said semiconductor body has a current carrier concentration of between $10^{12}$ and $10^{14}$ per cubic centimeter.

3. A semiconductor diode in accordance with claim 1 wherein said semiconductor body consists of silicon having a resistivity of at least 40 ohm cms.

4. A semiconductor diode in accordance with claim 3 wherein said partially reduced titanium dioxide has a resistivity of about 30 ohm centimeters.

5. A semiconductor diode in accordance with claim 1 wherein said diode comprises terminal leads connected to said conductive means and to said ohmic contact.

6. A semiconductor diode in accordance with claim 1 wherein said conductive means consists of a layer of silver.

7. A semiconductor diode in accordance with claim 1 wherein said semiconductor body is part of a microcircuit wafer, said wafer having an insulating layer on a planar surface thereof, said layer of titanium dioxide and said ohmic contact being located in closely spaced openings in said insulating layer.

References Cited

UNITED STATES PATENTS

| | | | |
|---|---|---|---|
| 2,766,509 | 10/1956 | Le Loup et al. | 317—238 |
| 2,994,811 | 8/1961 | Senitzky | 317—235 |
| 3,204,159 | 8/1965 | Bramley et al. | 317—238 |
| 3,257,305 | 6/1966 | Varga | 204—192 |
| 3,319,137 | 5/1967 | Braunstein et al. | 317—234 |

JAMES D. KALLAM, Primary Examiner

U.S. Cl. X.R.

317—234